(12) United States Patent
Zhang et al.

(10) Patent No.: US 9,065,464 B2
(45) Date of Patent: Jun. 23, 2015

(54) PHASE ADJUSTMENT SCHEME FOR TIME-INTERLEAVED ADCS

(71) Applicant: Broadcom Corporation, Irvine, CA (US)

(72) Inventors: Heng Zhang, Irvine, CA (US); Delong Cui, Tustin, CA (US); Jun Cao, Irvine, CA (US); Afshin Doctor Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/040,467

(22) Filed: Sep. 27, 2013

(65) Prior Publication Data

US 2015/0084800 A1    Mar. 26, 2015

Related U.S. Application Data

(60) Provisional application No. 61/881,893, filed on Sep. 24, 2013.

(51) Int. Cl.
*H03M 1/12* (2006.01)
*H03M 1/00* (2006.01)

(52) U.S. Cl.
CPC .. *H03M 1/12* (2013.01); *H03M 1/00* (2013.01)

(58) Field of Classification Search
CPC .................................. H03M 1/12; H03M 1/00
USPC .......................... 341/155, 156, 120, 118, 122
See application file for complete search history.

(56) References Cited

U.S. PATENT DOCUMENTS 8,487,795 B1 *  7/2013  Jiang et al. .................... 341/122

* cited by examiner

*Primary Examiner* — Joseph Lauture
(74) *Attorney, Agent, or Firm* — Fiala & Weaver P.L.L.C.

(57) ABSTRACT

Methods and apparatuses are described for versatile phase adjustment schemes comprising multi-layered clock skew correction with variable range and resolution to improve performance for a variety of ADC architectures, including TI-ADCs. Multi-stage phase alignment corrects misalignment in multiple stages at start-up and continuously or periodically during operation to reduce static sources of misalignment caused by design and fabrication and dynamic sources of misalignment caused by operational variations (e.g., voltage, temperature). Multi-path phase alignment corrects misalignment in the data path (e.g., analog path) and the clock path (e.g., digital path, analog path, CMOS path, CML path, or any combination thereof) for distributed alignment. Multi-lane phase alignment corrects misalignment in multiple time-interleaved signal lanes. Multi-resolution phase alignment corrects misalignment at three or more levels of resolution (e.g., coarse, fine and ultra-fine). Multi-type phase alignment corrects misalignment using different techniques (e.g., controlled current, resistance, capacitance) in a suitable path.

17 Claims, 6 Drawing Sheets

PHASE ADJUSTMENT SCHEME FOR TIME-INTERLEAVED ADCS

CROSS-REFERENCE TO RELATED APPLICATION(S)

This application claims the benefit of U.S. Provisional Patent Application No. 61/881,893, entitled "Phase Adjustment Scheme for Time-Interleaved ADCs," filed Sep. 24, 2013, the entirety of which is incorporated by reference herein.

BACKGROUND

1. Technical Field

The subject matter described herein relates to analog-to-digital converters (ADCs). In particular, the subject matter described herein relates to time-interleaved ADCs.

2. Description of Related Art

Conventional time-interleaved ADCs (TI-ADCs), in which a plurality of sub-ADCs operate on time-synchronized samples, have limited operating frequency. Dominant factors restricting operating frequency include the number of sub-ADCs that process time-synchronized analog input data in parallel and clock misalignment between them. For example, to achieve a 7-bit ENOB (i.e., effective number of bits) analog-to-digital conversion of an 8 GHz analog input, time interleaved sampling clocks must be matched within a clock skew of only 100 fs (i.e., $100 \times 10^{-15}$ seconds).

Clock skew or misalignment between sub-ADCs causes spurs in the output spectrum. Spurs degrade ADC performance, e.g., as indicated by spurious free dynamic range (SFDR), signal to noise and distortion ratio (SNDR) and the effective number of bits (ENOB). Thus, there is a general need to advance the state of the art and a specific need to improve clock alignment in time-interleaved ADCs.

BRIEF SUMMARY

Methods, systems, and apparatuses are described for versatile phase adjustment schemes comprising multi-layered clock skew correction with variable range and resolution to improve performance for a variety of ADC architectures, including TI-ADCs. Multi-stage phase alignment corrects misalignment in multiple stages at start-up and continuously or periodically during operation to reduce static sources of misalignment caused by design and fabrication and dynamic sources of misalignment caused by operational variations (e.g., voltage, temperature). Multi-path phase alignment corrects misalignment in the data path (e.g., an analog path) and the clock path (e.g., a digital path, an analog path, a complementary metal-oxide-semiconductor (CMOS) path, a current mode logic (CML) path, or any combination thereof) for distributed alignment. Multi-lane phase alignment corrects misalignment in multiple time-interleaved signal lanes. Multi-resolution phase alignment corrects misalignment at three or more levels of resolution (e.g., coarse, fine and ultrafine). Multi-type phase alignment corrects misalignment using different techniques (e.g., controlled current, resistance, capacitance) in a suitable path.

BRIEF DESCRIPTION OF THE DRAWINGS/FIGURES

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies. However, embodiments are not limited to the specific implementations disclosed herein. Unless expressly indicated by common numbering, each figure represents a different embodiment where components and steps in each embodiment are intentionally numbered differently compared to potentially similar components in other embodiments. The left-most digit(s) of a reference number identifies the number of the figure in which the reference number first appears.

Figure 1:
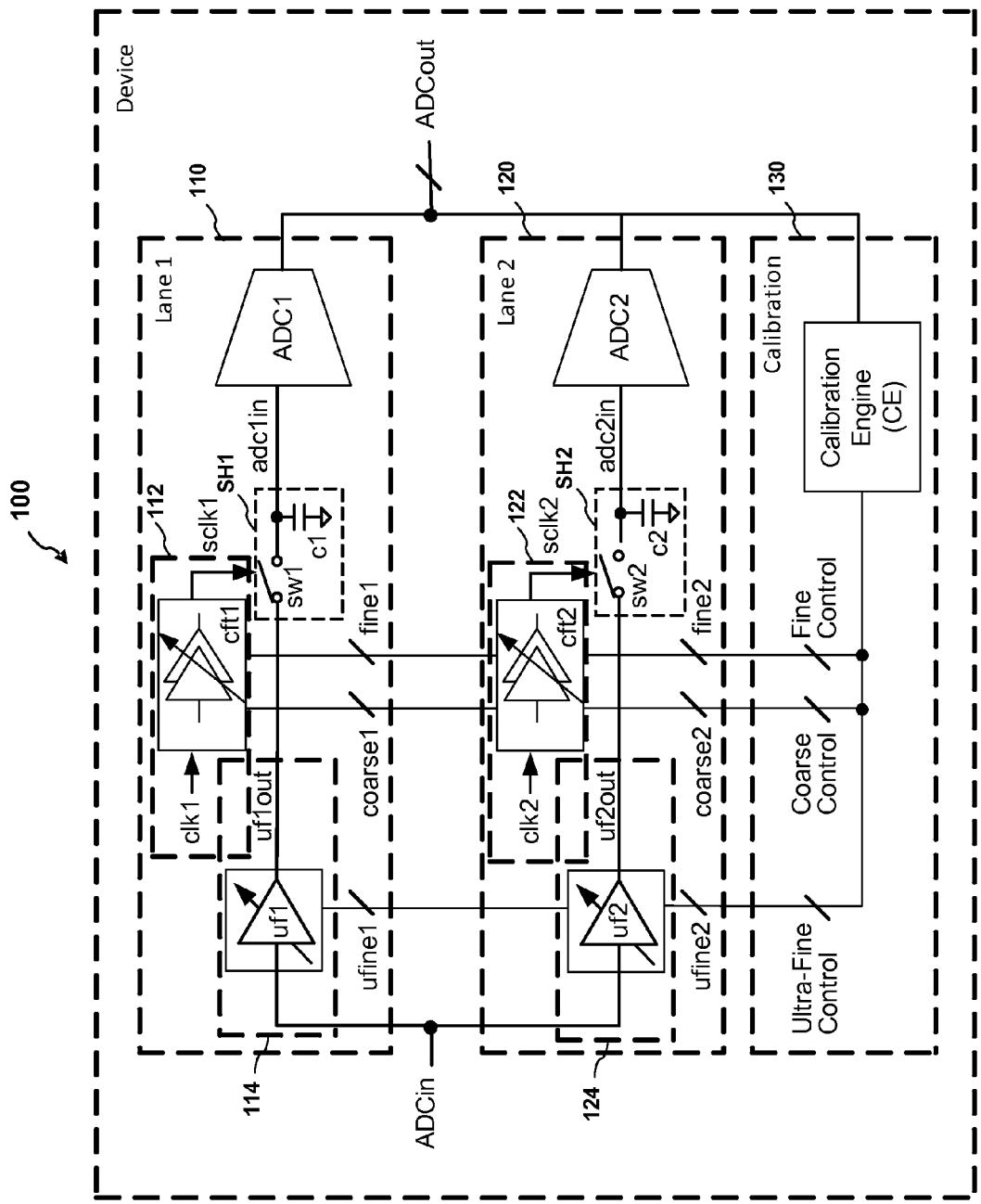
FIG. 1 shows a simplified block diagram of an exemplary embodiment of a phase adjustment scheme for a time-interleaved ADC comprising multi-path, multi-stage, multi-lane, multi-resolution and multi-technique phase adjustment.

Exemplary embodiments will now be described with reference to the accompanying figures.

DETAILED DESCRIPTION

I. Introduction

Reference will now be made to embodiments that incorporate features of the described and claimed subject matter, examples of which are illustrated in the accompanying drawings. While the technology will be described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example" or the like indicate that the subject matter described may include a particular feature, structure, characteristic, or step. However, other embodiments do not necessarily include the particular feature, structure, characteristic or step. Moreover, "embodiment," "example" or the like do not necessarily refer to the same embodiment. Further, when a particular feature, structure, characteristic or step is described in connection with an embodiment, it is submitted that it is within the knowledge of one skilled in the art to effect such feature, structure, or characteristic in connection with other embodiments whether or not those other embodiments are explicitly described.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or through an indirect electrical connection via other devices and connections.

Example embodiments relate to a phase adjustment scheme for time-interleaved ADCs. Example devices are described. A first example device includes a data path and a clock path. The data path has a data path timing calibration circuit. The clock path has a clock path timing calibration circuit. Control of the data path timing circuit and the clock path timing circuit is coordinated to calibrate timing of the first example device.

A second example device includes a first lane, a second lane, a course resolution timing circuit, a fine resolution timing circuit, and an ultrafine resolution timing circuit. The first lane has a first data path and a first clock path controlling a first timing in the first data path. The second lane has a second data path and a second clock path controlling a second timing in the second data path. The coarse resolution timing circuit is controllable to adjust a coarse timing difference between the first lane and the second lane. The fine resolution timing circuit is controllable to adjust a fine timing difference between the first lane and the second lane. The fine timing difference is smaller than the coarse timing difference. The ultrafine resolution timing circuit is controllable to adjust an ultrafine timing difference between the first lane and the second lane. The ultrafine timing difference is smaller than the fine timing difference.

An example method is described. In accordance with this method, timing in a time-interleaved ADC is calibrated by calibrating the timing in a plurality of stages of the ADC. The plurality of stages includes a startup stage and a post startup stage.

II. Exemplary Phase Adjustment Scheme for Time-Interleaved ADCs

Methods, systems, and apparatuses will now be described for versatile phase adjustment schemes comprising multi-layered clock skew correction with variable range and resolution to improve performance for a variety of ADC architectures, including TI-ADCs. Multi-stage phase alignment corrects misalignment in multiple stages at start-up and continuously or periodically during operation to reduce static sources of misalignment caused by design and fabrication and dynamic sources of misalignment caused by operational variations (e.g., voltage, temperature). Multi-path phase alignment corrects misalignment in the data path (e.g., an analog path) and the clock path (e.g., a digital path, an analog path, a complementary metal-oxide-semiconductor (CMOS) path, a current mode logic (CML) path, or any combination thereof) for distributed alignment. Multi-lane phase alignment corrects misalignment in multiple time-interleaved signal lanes. Multi-resolution phase alignment corrects misalignment at three or more levels of resolution (e.g., coarse, fine and ultra-fine). Multi-type phase alignment corrects misalignment using different techniques (e.g., controlled current, resistance, capacitance) in a suitable path.

Embodiments of systems, devices and methods may be implemented in various architectures, each with various configurations. Several detailed features and embodiments are discussed below. Functionality may be referenced as logic, components, modules, circuits and the like. Functionality may be implemented in digital, analog or combined components. Functionality may be implemented in hardware, software or a combination thereof.

As one of many examples of ADC topology in which embodiments may be implemented, FIG. 1 shows a simplified block diagram of an exemplary embodiment of a phase adjustment scheme for a time-interleaved ADC comprising multi-path, multi-stage, multi-lane, multi-resolution and multi-technique phase adjustment. The embodiment shown in FIG. 1 is a simplified diagram omitting known components in known ADC architectures that may be improved by the disclosed technology.

Device 100 may comprise any device having phase adjustment, including but not limited to an ADC, receiver (e.g., optical receiver, RF receiver), transceiver and other optical, wired or wireless devices performing timing-coordinated or synchronized processing, such as but not limited to conversion, equalization and demodulation. In this embodiment, device 100 comprises a time-interleaved ADC having analog input ADCIN and digital output ADCOUT. Device 100 is shown with two time-interleaved lanes, first lane (Lane 1) 110, second lane (Lane 2) 120, although various embodiments may have any number of lanes. Phase calibration or adjustment for first and second lanes 110, 120 is provided by calibration 130. Device or ADC 100 may comprise, for example, a 6-bit 10 giga-samples per second (GS/s) ADC that operates by time-interleaving four 6-bit 2.5 GS/s ADCs in lanes 1, 2, 3 and 4 (lanes 3 and 4 not shown). Each lane provides a sub ADC or channel in a multi-lane or multi-channel ADC.

Calibration 130 comprises calibration engine CE. Calibration engine CE comprises logic, such as one or more algorithms, implemented in hardware, software or a combination thereof to generate calibration control signals. Different signals or codes generated by calibration engine CE provide different calibrations. Calibration engine CE receives digital output ADCOUT, which is used by calibration logic to generate calibration control signals. In this embodiment, calibration engine CE generates coarse control, fine control and ultra-fine (ufine) control signals to provide three different resolutions of phase calibration where ultrafine resolution is higher resolution than fine resolution and fine resolution is higher resolution than coarse resolution. However, in other embodiments, calibration engine CE may generate control signals for more or fewer resolutions of phase calibration. Coarse calibration signals provided to first and second lanes 110, 120 are first coarse calibration signal COARSE1 and second coarse calibration signal COARSE2, respectively. Fine calibration signals provided to first and second lanes 110, 120 are first fine calibration signal FINE1 and second fine calibration signal FINE2, respectively. Ultrafine calibration signals provided to first and second lanes 110, 120 are first ultrafine calibration signal UFINE1 and second ultrafine calibration signal UFINE2, respectively.

First lane 110 comprises first ultrafine timing calibration circuit UF1, first coarse-fine timing calibration circuit CFT1, first sample and hold circuit SH1 and first ADC circuit ADC1. First lane 110 is a simplified diagram that may omit known components in known architectures that may be improved by the disclosed technology. First lane 110 receives analog input ADCIN, first coarse, fine and ultrafine calibration signals COARSE1, FINE1 and UFINE1. First lane 110 generates a first time-synchronized portion of digital output ADCOUT.

First ADC circuit ADC1 represents one of multiple sub ADC lanes or channels in device 100. First ADC circuit ADC1 converts analog samples into a digital stream of data. A non-limiting example of first ADC circuit ADC1 is a 6-bit 2.5 giga-samples per second (GS/s) flash ADC. The portion of digital output ADCOUT generated by first lane 110 is time-interleaved with portions of ADCOUT generated by second lane 120 and any other lanes in device 100. First ADC circuit ADC1 may comprise any known ADC components, e.g., programmable gain amplifier (PGA) (not shown).

First sample and hold circuit SH1 samples and holds samples of an input signal. First sample and hold circuit SH1 is shown with first switch SW1 and first capacitor C1. First switch SW1 exemplifies the sampling aspect and first capacitor C1 exemplifies the holding aspect of first sample and hold circuit SH1. First sample and hold circuit SH1 may be a simplified depiction of sample and hold circuit SH1. In some embodiments, first sample and hold circuit SH1 may comprise, for example, a sample and hold amplifier having one or more stages.

First coarse-fine timing calibration circuit CFT1 provides timing to first sample and hold circuit SH1, e.g., to operate first switch SW1. Specifically, first coarse-fine timing calibration circuit CFT1 implements coarse unit cells and fine unit cells to calibrate the phase of first input clock CLK1. First coarse-fine timing calibration circuit CFT1 is in a clock path 112 in first lane 110. The clock path 112 may include digital logic, analog logic, CMOS logic, CML, etc. or any combination thereof. First coarse-fine timing calibration circuit CFT1 receives first input clock CLK1, first coarse calibration signal COARSE1 and first fine calibration signal FINE1 and outputs first sampling clock SCLK1. First coarse-fine timing calibration circuit CFT1 is controlled by first coarse calibration signal COARSE1 and first fine calibration signal FINE1. First input clock may be generated by a clock synchronization circuit (not shown) that generates synchronized clocks for each lane or channel in device 100. An embodiment of first coarse-fine timing calibration circuit CFT1 is discussed with respect to FIG. 2.

First ultrafine timing calibration circuit UF1 provides ultrafine phase calibration for first lane 110. Specifically, first ultrafine timing calibration circuit UF1 implements ultrafine unit cell(s) to calibrate the timing of analog input ADCIN. First ultrafine timing calibration circuit UF1 is in a data path 114 or analog path of first lane 110. First ultrafine timing calibration circuit UF1 may comprise a dedicated circuit or may be integrated with another function, such as a buffer. First ultrafine timing calibration circuit UF1 receives analog input ADCIN and first ultrafine calibration signal UFINE1 and outputs first analog output UF1OUT. First ultrafine timing calibration circuit UF1 is controlled by first ultrafine calibration signal UFINE1. An embodiment of first ultrafine timing calibration circuit UF 1 is discussed with respect to FIG. 3.

In operation of first lane 110, first ultrafine timing calibration circuit UF1 is configured to provide ultrafine calibration, if needed, to analog input ADCIN in accordance with first ultrafine calibration signal UFINE1. The output of first ultrafine timing calibration circuit UF1, labeled UF1OUT, is provided to the input of first sample and hold circuit SH1. First switch SW1 samples UF1OUT in accordance with first sampling clock SCLK1 output by first course-fine timing calibration circuit CFT1, which is configured to provide coarse and fine calibration, if needed, to first clock input CLK1 in accordance with first coarse and fine calibration signals COARSE1, FINE1. The output of first sample and hold circuit SH1, labeled ADC1IN, is provided to the input of first ADC circuit ADC1 for conversion to digital output ADCOUT.

Second lane 120 comprises second ultrafine timing calibration circuit UF2, second coarse-fine timing calibration circuit CFT2, second sample and hold circuit SH2 and second ADC circuit ADC2. Second lane 120 is a simplified diagram that may omit known components in known architectures that may be improved by the disclosed technology. Second lane 120 receives analog input ADCIN, second coarse, fine and ultrafine calibration signals COARSE2, FINE2 and UFINE2. Second lane 120 generates a second time-synchronized portion of digital output ADCOUT.

Second ADC circuit ADC2 represents one of multiple sub ADC lanes or channels in device 100. Second ADC circuit ADC2 converts analog samples into a digital stream of data. A non-limiting example of second ADC circuit ADC2 is a 6-bit 2.5 giga-samples per second (GS/s) flash ADC. The portion of digital output ADCOUT generated by second lane 120 is time-interleaved with portions of ADCOUT generated by first lane 110 and any other lanes in device 100. Second ADC circuit ADC2 may comprise any known ADC components, e.g., programmable gain amplifier (PGA) (not shown).

Second sample and hold circuit SH2 samples and holds samples of an input signal. Second sample and hold circuit SH2 is shown with second switch SW2 and second capacitor C2. Second switch SW2 exemplifies the sampling aspect and second capacitor C2 exemplifies the holding aspect of second sample and hold circuit SH2. Second sample and hold circuit SH2 may be a simplified depiction of a sample and hold circuit. In some embodiments, second sample and hold circuit SH2 may comprise, for example, a sample and hold amplifier having one or more stages.

Second coarse-fine timing calibration circuit CFT2 provides timing to second sample and hold circuit SH2, e.g., to operate second sampling switch SW2. Specifically, second coarse-fine timing calibration circuit CFT2 implements coarse unit cells and fine unit cells to calibrate the phase of second input clock CLK2. Second coarse-fine timing calibration circuit CFT2 is in a clock path 122 in second lane 120. The clock path 122 may include digital logic, analog logic, CMOS logic, CML, etc. or any combination thereof. Second coarse-fine timing calibration circuit CFT2 receives second input clock CLK2, second coarse calibration signal COARSE2 and second fine calibration signal FINE2 and outputs second sampling clock SCLK2. Second coarse-fine timing calibration circuit CFT2 is controlled by second coarse calibration signal COARSE2 and second fine calibration signal FINE2. Second input clock may be generated by a clock synchronization circuit (not shown) that generates synchronized clocks for each lane or channel in device 100. An embodiment of second coarse-fine timing calibration circuit CFT2 is discussed with respect to FIG. 2.

Second ultrafine timing calibration circuit UF2 provides ultrafine phase calibration for second lane 120. Specifically, second ultrafine timing calibration circuit UF2 implements ultrafine unit cell(s) to calibrate the timing of analog input ADCIN. Second ultrafine timing calibration circuit UF2 is in a data path 124 or analog path of second lane 120. Second ultrafine timing calibration circuit UF2 may comprise a dedicated circuit or may be integrated with another function, such as a buffer. Second ultrafine timing calibration circuit UF2 receives analog input ADCIN and second ultrafine calibration signal UFINE2 and outputs second analog output UF2OUT. Second ultrafine timing calibration circuit UF2 is controlled by second ultrafine calibration signal UFINE2. An embodiment of second ultrafine timing calibration circuit UF2 is discussed with respect to FIG. 3.

In operation of second lane 120, second ultrafine timing calibration circuit UF2 is configured to provide ultrafine calibration, if needed, to analog input ADCIN in accordance with second ultrafine calibration signal UFINE2. The output of second ultrafine timing calibration circuit UF2, labeled UF2OUT, is provided to the input of second sample and hold circuit SH2. Second switch SW2 samples UF2OUT in accordance with second sampling clock SCLK2, which is output by second coarse-fine timing calibration circuit CFT2. Second coarse-fine timing calibration circuit CFT2 is configured to provide coarse and fine calibration, if needed, to second clock input CLK2 in accordance with second coarse and fine calibration signals COARSE2, FINE2. The output of second sample and hold circuit SH2, labeled ADC2IN, is provided to the input of second ADC circuit ADC2 for conversion to digital output ADCOUT.

In the embodiment shown in FIG. 1, coarse and fine calibration are implemented in a clock or digital path while ultrafine calibration is implemented in a data or analog path. In other embodiments, multi-resolution phase calibration may be implemented with two or more resolutions in data paths, clock paths, analog paths and/or digital paths of a lane of device 100 with timing synchronization. Multi-resolution calibration may be centralized or distributed. In FIG. 1, coarse and fine calibration are implemented together, apart from ultrafine calibration, but in other embodiments may be implemented together or separately.

Figure 2:
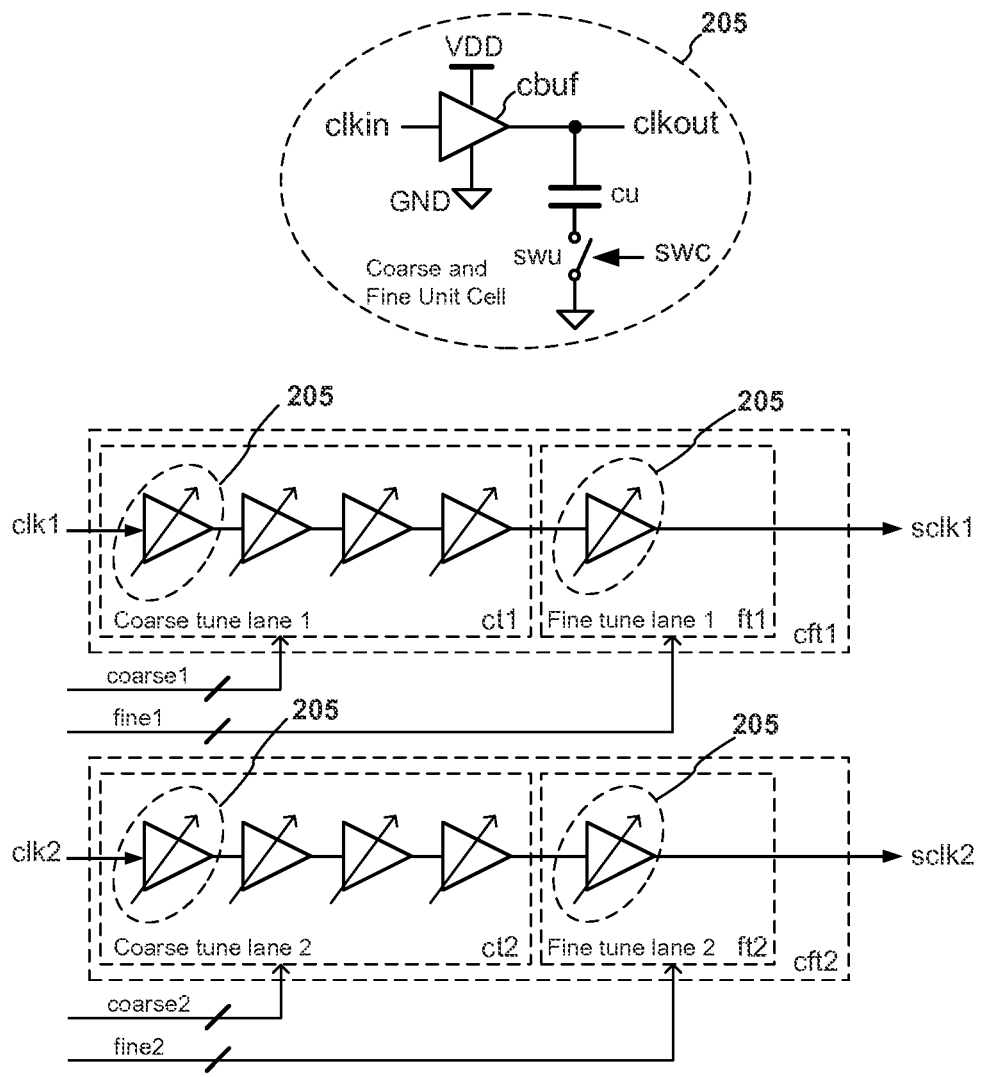
FIG. 2 shows a simplified block diagram of an exemplary embodiment of coarse and fine timing calibration cells.

FIG. 2 shows a simplified block diagram of an exemplary embodiment of coarse and fine timing calibration cells. FIG. 2 illustrates one of numerous possible embodiments of first and second coarse-fine timing calibration circuits CFT1, CFT2 shown in FIG. 1. In this embodiment, first coarse-fine timing calibration circuit CFT1 comprises first coarse tuning circuit CT1 and first fine tuning circuit FT1. Similarly, coarse-fine timing calibration circuit CFT2 comprises second coarse tuning circuit CT2 and second fine tuning circuit FT2. As shown implemented in the clock path 112 of first lane 110, first input clock CLK1 is phase adjusted, if necessary, to first sampling clock SCLK1 by operation of first coarse tuning lane CT1 and first fine tuning lane FT1. As shown implemented in the clock path 122 of second lane 120, second input clock CLK2 is phase adjusted, if necessary, to second sampling clock SCLK2 by operation of second coarse tuning lane CT2 and second fine tuning lane FT2.

Figure 4A:
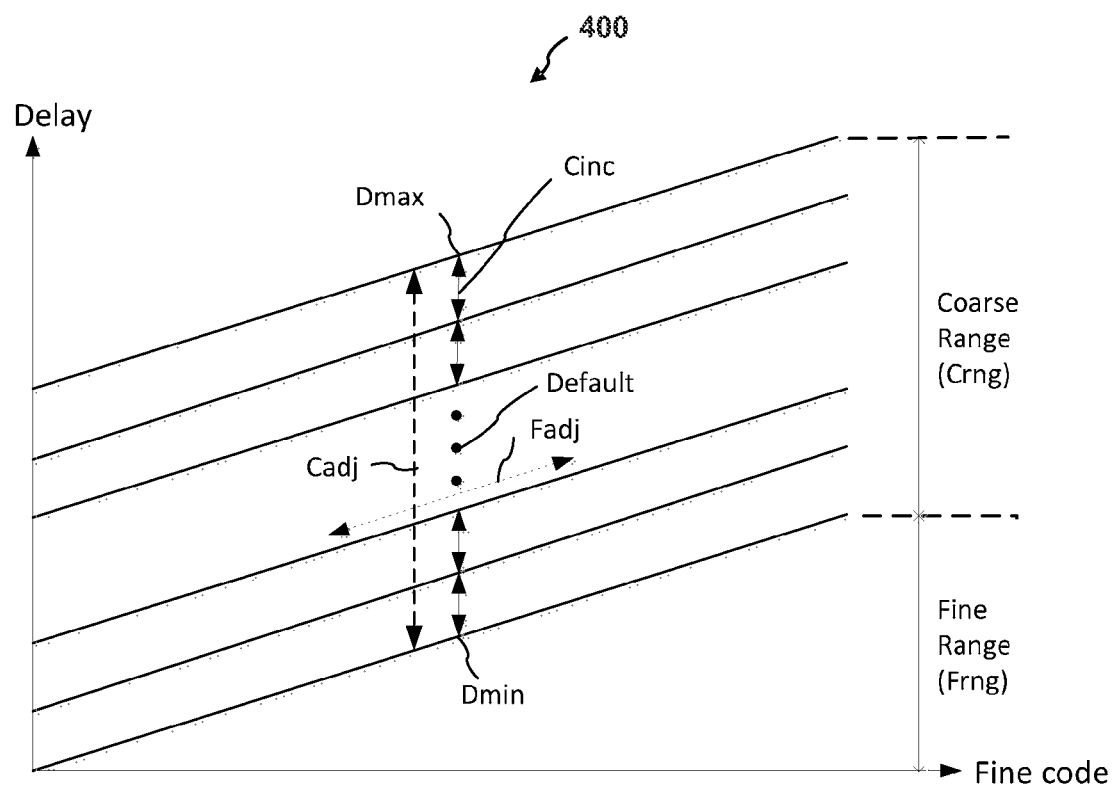
FIGS. 4a and 4b show a graph and flowchart of an exemplary embodiment of multi-resolution and multi-stage timing calibration.

The number and configuration of tuning circuits and their range(s) and resolution(s) may vary between embodiments. An exemplary depiction of incremental calibration using coarse and fine unit cells 205 is shown in FIG. 4a. Other embodiments, may implement only one of coarse, fine and ultrafine tuning circuits in a given lane or channel while other embodiments may implement any two or more tuning circuits in each lane or channel. Each channel may implement the same or different calibration unit cells. Some or all calibration unit cells may be implemented in a timing synchronization circuit that generates input clocks for each lane or channel.

In this embodiment, first coarse tuning circuit CT1 comprises a bank, array or cascade of unit cells 205 in the clock path 112 of first lane 110. Each unit cell may be switched in and out of the clock path 112 or varied in the clock path 112. However, the number, type and configuration of unit cells in a calibration circuit may vary between embodiments. In other embodiments, coarse and/or fine calibration may be implemented in the data path 114 or analog path or in different paths. Each unit cell 205 is controlled by one or more control lines in first coarse calibration signal COARSE1. Each unit cell 205 provides at least one coarse timing increment. One cell may provide multiple increments and may be continuously variable. The magnitude of increments and uniformity or non-uniformity of increments may vary between embodiments. Resolution (i.e., increment magnitude) may vary between embodiments. The coarse timing adjustment range is defined by the total number of coarse unit cells 205 and the total magnitude of increment(s) in each cell.

First fine tuning circuit FT1 comprises at least one unit cell 205 in the clock path 112 of first lane 110. Each unit cell may be switched in and out of the clock path 112 or varied in the clock path 112. However, the number, type and configuration of unit cells in a calibration circuit may vary between embodiments. In other embodiments, coarse and/or fine calibration may be implemented in the data path 114 or analog path or in different paths. Each unit cell 205 is controlled by one or more control lines in first fine calibration signal FINE 1. Each unit cell 205 provides at least one fine timing increment. One cell may provide multiple increments and may be continuously variable. The magnitude of increments and uniformity or non-uniformity of increments may vary between embodiments. Resolution (i.e., increment magnitude) may vary between embodiments. The fine timing adjustment range is defined by the total number of fine unit cells 205 and the total magnitude of increment(s) in each cell. For example, in embodiments such as this one that implement coarse calibration, a range of first fine tuning circuit FT1 may comprise the range of one coarse unit cell, except with higher resolution (i.e., smaller increments or continuous variation) compared to coarse unit cell resolution. As shown implemented in the clock path 112 of first lane 110, first input clock CLK1 is phase adjusted, if necessary, to first sampling clock SCLK1 by operation of first coarse tuning lane CT1 and first fine tuning lane CT2.

Second coarse tuning circuit CT2 comprises a bank or cascade of unit cells 205 in the clock path 122 of second lane 120. Each unit cell may be switched in and out of the clock path 122 or varied in the clock path 122. However, the number, type and configuration of unit cells in a calibration circuit may vary between embodiments. In other embodiments, coarse and/or fine calibration may be implemented in the data path 124 or analog path or in different paths. Each unit cell 205 is controlled by one or more control lines in second coarse calibration signal COARSE2. Each unit cell 205 provides at least one coarse timing increment. One cell may provide multiple increments and may be continuously variable. The magnitude of increments and uniformity or non-uniformity of increments may vary between embodiments. Resolution (i.e., increment magnitude) may vary between embodiments. The coarse timing adjustment range is defined by the total number of coarse unit cells 205 and the total magnitude of increment(s) in each cell.

Second fine tuning circuit FT2 comprises at least one unit cell 205 in the clock path 122 of second lane 120. Each unit cell may be switched in and out of the clock path 122 or varied in the clock path 122. However, the number, type and configuration of unit cells in a calibration circuit may vary between embodiments. In other embodiments, coarse and/or fine calibration may be implemented in the data path 124 or analog path or in different paths. Each unit cell 205 is controlled by one or more control lines in second fine calibration signal FINE2. Each unit cell 205 provides at least one fine timing increment. One cell may provide multiple increments and may be continuously variable. The magnitude of increments and uniformity or non-uniformity of increments may vary between embodiments. Resolution (i.e., increment magnitude) may vary between embodiments. The fine timing adjustment range is defined by the total number of fine unit cells 205 and the total magnitude of increment(s) in each cell. For example, in embodiments such as this one that implement coarse calibration, a range of second fine tuning circuit FT2 may comprise the range of one coarse unit cell, except with higher resolution (i.e., smaller increments or continuous variation) compared to coarse unit cell resolution.

Unit cell 205 provides one of many possible unit cell configurations. Specifically, unit cell 205 presents a switched capacitor unit cell. Each cell may have one or more switched capacitors. In other embodiments, unit cell 205 may, for example, comprise a programmable resistor cell, programmable current cell, programmable capacitor, digitally controlled varactor as clock driver load or other technique that may be used to calibrate timing. Various calibration techniques may have different performance qualities and resolutions suitable for one or more calibration resolutions.

In this embodiment, unit cell 205 comprises a clock buffer CBUF, unit capacitor CU and unit switch SWU. Inputs to unit cell 205 include input clock CLKIN and switch control SWC while outputs include output clock CLKOUT. Depending on which lane unit cell 205 is located in first or second coarse tuning circuit CT1 or CT2, input clock CLKIN may be coupled to first input clock CLK1 (lane 1) or second input clock CLK2 (lane 2). Similarly, depending on which lane unit cell 205 is located in first or second fine tuning circuit FT1 or FT2, output clock CLKOUT may be coupled to first sampling clock SCLK1 or second sampling clock SCLK2.

Clock buffer CBUF is coupled to a voltage source VDD and ground GND. Clock buffer CBUF receives clock input CLKIN and generates output clock CLKOUT. Depending on which coarse and fine control signals are activated, one or more unit switches may be closed. Each unit cell 205 that is activated (i.e., unit switch CU closed) introduces a delay by adding capacitive loading to output clock CLKOUT, which may be a sampling clock in first lane 110 or second lane 120.

Unit switch SWU may comprise any switch, though high speed switches, such as semiconductor switches, may be more suitable in high speed applications.

Unit capacitor CU may comprise any number of capacitors and any type of capacitor, although some capacitors may be better suited than others. For example, unit capacitor may comprise finger capacitor(s). Implementing unit cell 205, or a plurality thereof, as a switchable finger capacitor bank provides a linear step size, small variation across corners, high density capacitance in a small area, simple implementation of coarse and fine resolutions, unlimited driver current permitting faster rise and fall times, improved noise and jitter performance and a flexible, expandable design for adaptation to a wide variety of ranges and resolutions to meet specific design requirements. Fine and coarse unit cells may be distinguished by capacitance. Coarse tuning cells may have larger unit capacitors than fine tuning cells in order to have larger increments (resolution) and range. Simultaneous control of a cascade of coarse and fine unit cells permits a very wide range with high resolution. For example, a fine unit cell implemented with a switched capacitor may provide a resolution of 30 fs. In some embodiments, a course-fine calibration scheme in the clock path with a resolution less than 50 fs may cover 3Σ (sigma) random mismatch.

It will be recognized that the embodiment shown in FIG. 2 may be implemented in digital logic, analog logic, CMOS logic, CML, etc. or any combination thereof. It will also be recognized that the embodiment shown in FIG. 2 may be implemented in a data path and/or in a clock path.

Figure 3:
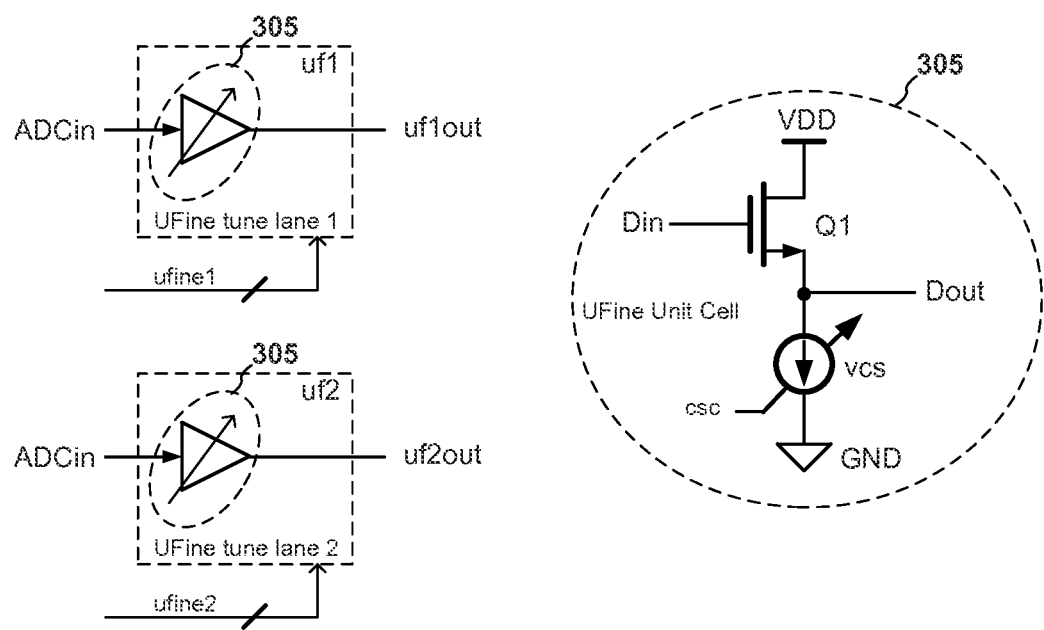
FIG. 3 shows a simplified block diagram of an exemplary embodiment of ultrafine timing calibration cells.

FIG. 3 shows a simplified block diagram of an exemplary embodiment of ultrafine timing calibration cells. FIG. 3 illustrates one of numerous possible embodiments of first and second ultrafine timing calibration circuits UF1, UF2 shown in FIG. 1. In this embodiment, first ultrafine timing calibration circuit UF1 is implemented in the data path 114 of first lane 110. In first lane 110, analog input ADCIN is phase adjusted, if necessary, by operation of first ultrafine timing calibration circuit UF 1. Similarly, second ultrafine timing calibration circuit UF2 is implemented in the data path 124 of second lane 120. In second lane 120, analog input ADCIN is phase adjusted, if necessary, by operation of second ultrafine timing calibration circuit UF2.

The number and configuration of tuning circuits and their range(s) and resolution(s) may vary between embodiments. Some embodiments may implement only one of coarse, fine and ultrafine tuning circuits in a given lane or channel while other embodiments may implement any two or more tuning circuits in each lane or channel. Each channel may implement the same or different calibration unit cells. Ultrafine calibration may or may not be implemented in various embodiments and may be implemented in clock and/or data paths, digital and/or analog paths in various embodiments. Some or all calibration unit cells may be implemented in a timing synchronization circuit that generates input clocks for each lane or channel.

First ultrafine timing calibration circuit UF1 comprises at least one unit cell 305 in the data path 114 of first lane 110. Each unit cell 305 may be switched in and out of the data path 114 or varied in the data path 114. However, the number, type and configuration of unit cells in a calibration circuit may vary between embodiments. In other embodiments, ultrafine calibration may be implemented in the data path 114 or analog path or in different or multiple paths of first lane 110. Each unit cell 305 is controlled by one or more control lines in first ultrafine calibration signal UFINE1. Each unit cell 305 provides at least one ultrafine timing increment, where a minimum increment represents ultrafine resolution. One cell may provide multiple increments and may be continuously variable. The magnitude of increments and uniformity or non-uniformity of increments may vary between embodiments. Resolution (i.e., increment magnitude) may vary between embodiments. The ultrafine timing adjustment range is defined by the total number of ultrafine unit cells 305 and the total magnitude of increment(s) in each ultrafine unit cell 305. As shown implemented in the data path 114 of first lane 110, analog input ADCIN is phase adjusted, if necessary by operation of first ultrafine timing calibration circuit UF1, to generate first ultrafine output UF1OUT, which is subsequently sampled by first sample and hold circuit SH1.

Second ultrafine timing calibration circuit UF2 comprises at least one unit cell 305 in the data path 124 of second lane 120. Each unit cell 305 may be switched in and out of the data path 124 or varied in the data path 124. However, the number, type and configuration of unit cells in a calibration circuit may vary between embodiments. In other embodiments, ultrafine calibration may be implemented in the data path 124 or analog path or in different or multiple paths of second lane 120. Each unit cell 305 is controlled by one or more control lines in second ultrafine calibration signal UFINE2. Each unit cell 305 provides at least one ultrafine timing increment, where a minimum increment represents ultrafine resolution. One cell may provide multiple increments and may be continuously variable. The magnitude of increments and uniformity or non-uniformity of increments may vary between embodiments. Resolution (i.e., increment magnitude) may vary between embodiments. The ultrafine timing adjustment range is defined by the total number of ultrafine unit cells 305 and the total magnitude of increment(s) in each ultrafine unit cell 305. As shown implemented in the data path 124 of second lane 120, analog input ADCIN is phase adjusted, if necessary by operation of second ultrafine timing calibration circuit UF2, to generate second ultrafine output UF2OUT, which is subsequently sampled by second sample and hold circuit SH2.

Unit cell 305 provides one of many possible unit cell configurations. Specifically, unit cell 305 presents a source-follower buffer having a variable (controllable) current source. Each cell may have one or more buffers. In other embodiments, unit cell 305 may, for example, comprise a programmable resistor cell, programmable current cell, programmable capacitor, switched capacitor, digitally controlled varactor as clock driver load or other technique that may be used to calibrate timing. Various calibration techniques may have different performance qualities and resolutions suitable for one or more calibration resolutions.

In this embodiment, unit cell 305 comprises transistor Q1 and variable current source VCS. Inputs to unit cell 305 include input data DIN and current source control CSC while outputs include output data DOUT. In the embodiment shown in FIG. 1, input data DIN may be coupled to analog input ADCIN. Depending on which lane unit cell 305 is located, current source control CSC may be coupled to first ultrafine calibration signal UFINE1 or second ultrafine calibration signal UFINE2. Similarly, depending on which lane unit cell 305 is located, output data DOUT may be coupled to first ultrafine output UF1OUT or second ultrafine output UF2OUT.

Transistor Q1 comprises a NMOS transistor having drain node coupled to voltage source VDD, gate node coupled to data input DIN and source node coupled to output data DOUT. In other embodiments, other transistors and appropriate configurations may implement ultrafine unit cell 305. Variable current source VCS is coupled between ground and the source node of transistor Q1. Variable current source VCS may be controlled by an analog or digital signal. Thus, variable current source VCS may comprise a control or interface circuit that accepts current source control signal CSC. Transistor Q1 receives data input DIN and generates output data DOUT. A setting or tuning of current source control signal CSC introduces a delay in data output DOUT, which may occur in first lane 110 or second lane 120.

Implementing ultrafine unit cell 305, or a plurality thereof in the data path of one or more lanes of device 100 permits ultrafine calibration, which may be used to increase resolution and range provided by coarse-fine calibration in the clock path. For example, an ultrafine unit cell implemented with a source-follower buffer having a variable current source may provide a resolution of 10 fs. A source follower has negligible impact on data path performance, e.g., as measured by the impact on gain and bandwidth. Of course, ultrafine calibration may also be implemented in a digital path using, for example, a CMOS digital buffer, as opposed to an analog buffer.

It will be recognized that the embodiment shown in FIG. 3 may be implemented in digital logic, analog logic, CMOS logic, CML, etc. or any combination thereof. It will also be recognized that the embodiment shown in FIG. 3 may be implemented in a data path and/or in a clock path.

III. Exemplary Methods

Embodiments may also be implemented in processes or methods. Embodiments described with respect to FIGS. 1-4a and other embodiments in accordance with the technical subject matter described herein may operate according to methods presented herein.

Figure 4B:
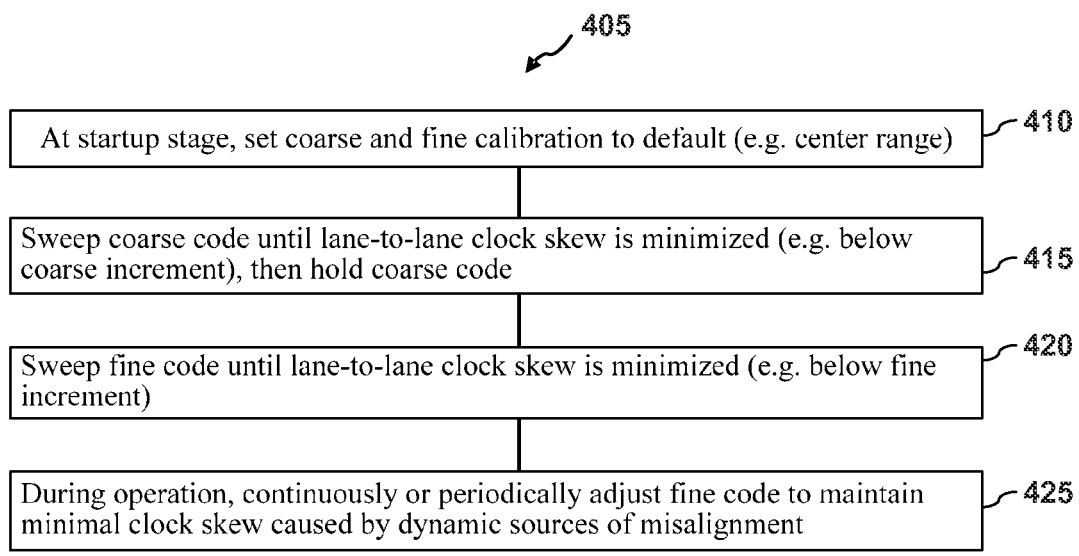

FIGS. 4a and 4b show a graph and flowchart of an exemplary embodiment of multi-resolution and multi-stage timing calibration. As shown in FIG. 4a, graph 400 graphs on the x-axis, fine calibration control code (e.g., FINE1 or FINE2) applied to various coarse calibration code (e.g., COARSE1 or COARSE2) and, graphs on the y-axis, the resulting timing delay (e.g., delay added to CLK1 or CLK2). Each solid line represents a coarse calibration setting. Coarse increments CINC are identified between each coarse calibration line. Without application of a fine calibration, these solid coarse calibration lines would be flat. The sloped line from left to right indicates increasing application of fine calibration to a particular coarse calibration setting. As indicated in FIG. 4a, coarse adjustment CADJ moves timing delay vertically between solid lines representing coarse settings while fine adjustment FADJ moves timing delay more gradually with higher resolution. The total coarse range CRNG is the total delay coarse adjustment CADJ is capable of implementing. The total fine range FRNG is the total delay fine adjustment FADJ is capable of implementing.

As shown in FIG. 4b with reference to FIGS. 1-4a, method 405 presents one of many possible embodiments of multi-resolution and multi-stage timing calibration. Method 405 begins with step 410. In step 410, at startup stage, coarse and fine calibration are set to default (e.g., center range). For example, calibration codes for COARSE1, COARSE2, FINE1, FINE2 are set so that CFT1, CFT2 provide coarse and fine calibration at the center of coarse and fine calibration range, respectively. As shown in FIG. 4a, coarse and fine calibration settings may be set to their center settings in the center of the calibration range, as indicated by DEFAULT. In other embodiments, default may be any settings for coarse, fine, ultrafine and any other calibration resolutions. Fine calibration set at its centerpoint or default setting combined with maximum coarse setting results in default maximum DMAX. Fine calibration set at its centerpoint or default setting combined with minimum coarse setting is indicated by default minimum DMIN. By setting each calibration range at its central setting, calibration may move equally in both directions, essentially speeding up and slowing down clocks and/ or data.

In step 415, still at startup stage, coarse code is swept until lane-to-lane clock skew is minimized (e.g., below coarse increment), then coarse code is held at this setting. For example, as shown in FIG. 1, for a given analog input ADCIN, calibration engine CE monitors for skew in excess of coarse increment CINC between first and second input clocks CLK1, CLK2, e.g., by monitoring digital output ADCOUT. Calibration engine CE makes coarse adjustments CADJ to first and/or second coarse calibration signals COARSE1, COARSE2 from their default settings as shown in FIG. 4a until skew between first and second input clocks CLK1, CLK2 is less than a minimum coarse increment CINC (i.e., coarse resolution). At that point, the coarse calibration settings for first and second coarse calibration signals COARSE1, COARSE2 are fixed.

In step 420, still at startup stage, with coarse code fixed for the time being, fine code is swept until lane-to-lane clock skew is minimized (e.g., below fine increment). For example, as shown in FIG. 1, for a given analog input ADCIN, calibration engine CE monitors for skew in excess of a fine increment between first and second input clocks CLK1, CLK2, e.g., by monitoring digital output ADCOUT. Calibration engine CE makes fine adjustments FADJ to first and/or second fine calibration signals FINE1, FINE2 from their default settings as shown in FIG. 4a until skew between first and second input clocks CLK1, CLK2 is less than a minimum fine increment (i.e., fine resolution).

In step 425, during operation stage, fine code is continuously or periodically adjusted to maintain minimal clock skew caused by dynamic sources of misalignment. For example, as shown in FIG. 1, calibration engine CE monitors for skew in excess of a fine increment between first and second input clocks CLK1, CLK2, e.g., by monitoring digital output ADCOUT. Calibration engine CE makes fine adjustments FADJ to first and/or second fine calibration signals FINE1, FINE2 to maintain skew between first and second input clocks CLK1, CLK2 less than a minimum fine increment (i.e., fine resolution).

Other embodiments may implement more or fewer steps with and without a particular order. For example, some embodiments may adjust coarse and/or ultrafine calibration during one or more stages, such as but not limited to startup and operation.

Figure 5:
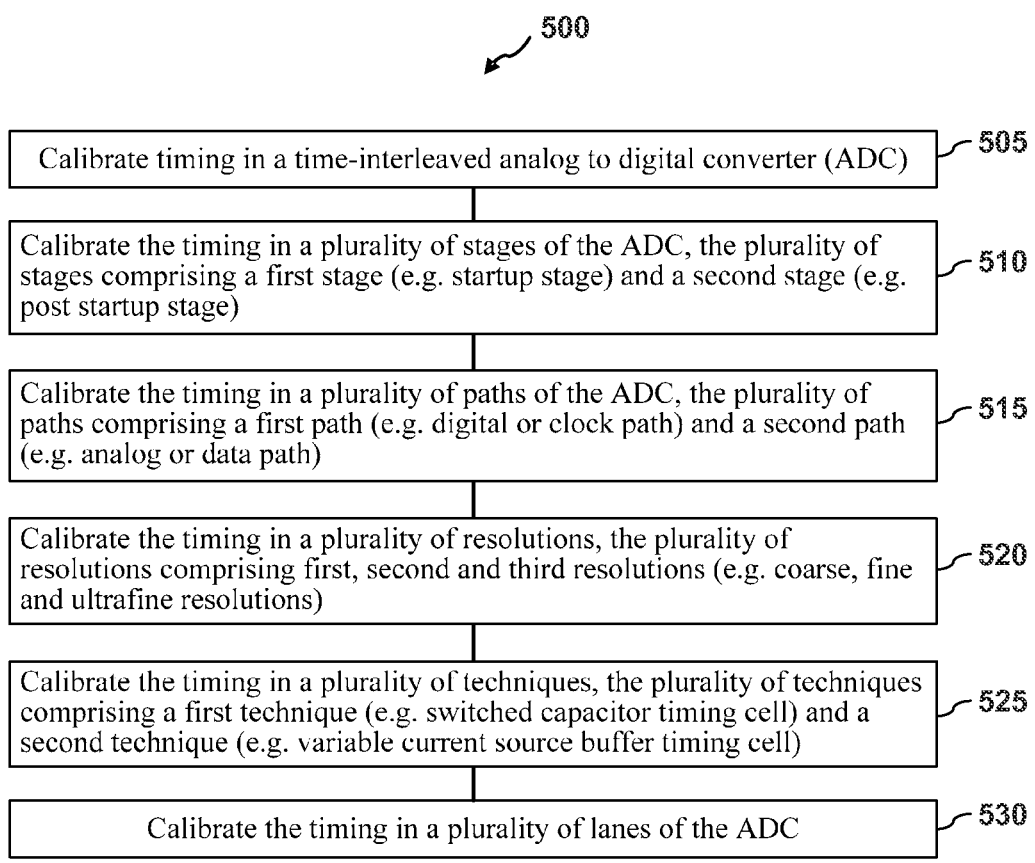
FIG. 5 shows a flowchart of an exemplary embodiment of a phase adjustment scheme for a time-interleaved ADC comprising multi-path, multi-stage, multi-lane, multi-resolution and multi-technique phase adjustment.

FIG. 5 shows a flowchart of an exemplary embodiment of a phase adjustment scheme for a time-interleaved ADC comprising multi-path, multi-stage, multi-lane, multi-resolution and multi-technique phase adjustment. Method 500 begins at step 505, where timing or phase is calibrated in a time-interleaved analog-to-digital converter (ADC). For example, as shown in FIG. 1, device 100 may represent a time-interleaved ADC having multiple lanes, e.g., first lane 110 and second lane 120, calibrated by calibration engine CE controlling first and second coarse-fine timing calibration circuits CFT1, CFT2 and first and second ultrafine calibration circuits UF1, UF2.

In step 510, timing calibration occurs in a plurality of stages of the ADC, the plurality of stages comprising a first stage (e.g., startup stage) and a second stage (e.g., post startup stage). For example, as discussed with respect to FIGS. 4a-4b in view of FIGS. 1, 2 and 3, calibration by calibration engine CE occurs during a first stage (e.g., startup stage) and during a second stage (e.g., post startup stage).

In step 515, timing calibration occurs in a plurality of paths of the ADC, the plurality of paths comprising a first path (e.g., clock path) and a second path (e.g., data path). For example, as shown in FIGS. 1-3, coarse and fine resolution calibration are provided in a clock path of device 100 by first and second coarse-fine timing calibration circuits CFT1, CFT2 controlled by calibration engine CE. Further, as shown in FIGS. 1-3, ultrafine calibration is provided in a data path of device 100 by first and second ultrafine timing calibration circuits UF1, UF2 controlled by calibration engine CE.

In step 520, timing calibration occurs in a plurality of resolutions, the plurality of resolutions comprising first, second and third resolutions (e.g., coarse, fine and ultrafine resolutions). For example, as shown in FIGS. 1-4b, timing is calibrated using at least two resolutions, e.g., any two of coarse, fine and ultrafine resolutions. Coarse and fine resolution calibration are provided by first and second coarse-fine timing calibration circuits CFT1, CFT2 controlled by calibration engine CE. Further, ultrafine calibration is provided by first and second ultrafine timing calibration circuits UF1, UF2 controlled by calibration engine CE.

In step 525, timing calibration occurs in a plurality of techniques, the plurality of techniques comprising a first technique (e.g., switched capacitor timing cell) and a second technique (e.g., variable current source buffer timing cell). For example, as shown in FIGS. 2 and 3, coarse-fine unit cell 205 provides calibration using a switched capacitor technique while ultrafine unit cell 305 provides calibration using a variable current source buffer technique.

In step 530, timing calibration occurs in a plurality of lanes of the ADC. For example, as shown in FIGS. 1-3, calibration occurs in first and second lanes 110, 120.

Methods presented herein are presented without arrows to demonstrate that no order of steps is required unless expressly indicated or inherently required. Methods presented herein are only a few of many possible methodological embodiments. Other structural and operational embodiments will be apparent to persons skilled in the relevant art(s) based on the foregoing discussion of embodiments. There is no requirement that a method embodiment implement all of the steps illustrated or discussed. Embodiments may implement fewer, more or different steps.

IV. Conclusion

While various embodiments have been described above, it should be understood that they have been presented by way of example only, and not limitation. It will be understood by those skilled in the relevant art(s) that various changes in form and details may be made to such embodiments without departing from the spirit and scope of the subject matter of the present application.

Methods and apparatuses have been described for versatile phase adjustment schemes comprising multi-layered clock skew correction with variable range and resolution to improve performance for a variety of ADC architectures, including TI-ADCs. Multi-stage phase alignment corrects misalignment in multiple stages at start-up and continuously or periodically during operation to reduce static sources of misalignment caused by design and fabrication and dynamic sources of misalignment caused by operational variations (e.g., voltage, temperature). Multi-path phase alignment corrects misalignment in the data path (e.g., an analog path) and the clock path (e.g., a digital path, an analog path, a CMOS path, a CML path, or any combination thereof) for distributed alignment. Multi-lane phase alignment corrects misalignment in multiple time-interleaved signal lanes. Multi-resolution phase alignment corrects misalignment at three or more levels of resolution (e.g., coarse, fine and ultra-fine). Multi-type phase alignment corrects misalignment using different techniques (e.g., controlled current, resistance, capacitance) in a suitable path.

Implementation of any one of many embodiments may improve timing synchronization, resulting in improved performance, e.g., as indicated by spurious free dynamic range (SFDR), signal to noise and distortion ratio (SNDR) and the effective number of bits (ENOB).

Embodiments are not limited to the functional blocks, detailed examples, steps, order or the entirety of subject matter presented in the figures, which is why the figures are referred to as exemplary embodiments. A device, apparatus or machine may comprise any one or more features described herein in any configuration. A method may comprise any process described herein, in any order, using any modality.

There are no limitations on application of embodiments. For example, without limitation, embodiments may be used in present and future 10 Gb/s, 25 Gb/s, 40 Gb/s, 100 Gb/s (and beyond) multi-mode fiber, backup plane, chip-2-chip and wireless transceivers, enterprise networking receiver solutions, optical and hard disk drive applications and any other timing synchronization applications.

A device (i.e., apparatus), as defined herein, is a machine or manufacture as defined by 35 U.S.C. §101. Devices may be digital, analog or a combination thereof. Devices may be implemented with any semiconductor process or semiconductor technology, including one or more of a Bipolar Junction Transistor (BJT), a heterojunction bipolar transistor (HBT), a metal oxide field effect transistor (MOSFET)

device, a metal semiconductor field effect transistor (MESFET) or other transconductor or transistor technology device. Such alternative devices may require alternative configurations other than the configuration illustrated in embodiments presented herein.

Techniques, including methods, described herein may be implemented by hardware (digital and/or analog) or a combination of hardware and software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, apparatus, machine, system, computer, module, media and the like is a machine and/or manufacture defined by 35 U.S.C. §101.

While a limited number of embodiments have been described, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the disclosed technologies. The exemplary appended claims encompass embodiments and features described herein, modifications and variations thereto as well as additional embodiments and features that fall within the true spirit and scope of the disclosed technologies. Thus, the breadth and scope of the disclosed technologies should not be limited by any of the above-described exemplary embodiments, but should be defined only in accordance with the following claims and their equivalents.

What is claimed is:

1. A device comprising:
  a clock path having a clock path timing calibration circuit that comprises:
    a first calibration circuit having a first timing resolution; and
    a second calibration circuit having a second timing resolution;
  a data path having a data path timing calibration circuit that comprises:
    a third calibration circuit having a third timing resolution; and
  coordinated control of the data path timing circuit and the clock path timing circuit to calibrate timing of the device;
  wherein the first, second and third resolutions are different.

2. The device of claim 1, wherein the first timing resolution is coarse, the second timing resolution is fine and the third timing resolution is ultrafine.

3. The device of claim 2, wherein the first and second calibration circuits comprise a plurality of switched capacitor cells and the third calibration circuit comprises programmable current source cells.

4. The device of claim 3, wherein the first, second and third calibration circuits are located in each of a plurality of lanes in a time-interleaved analog-to-digital converter (ADC).

5. The device of claim 4, further comprising:
  a calibration engine that calibrates at least one of the first, second and third calibration circuits during startup and periodically during operation of the ADC.

6. A device comprising:
  a first lane having a first data path and a first clock path controlling a first timing in the first data path;
  a second lane having a second data path and a second clock path controlling a second timing in the second data path;
  a coarse resolution timing circuit controllable to adjust a coarse timing difference between the first lane and the second lane;
  a fine resolution timing circuit controllable to adjust a fine timing difference, smaller than the coarse timing difference, between the first lane and the second lane; and
  an ultrafine resolution timing circuit controllable to adjust an ultrafine timing difference, smaller than the fine timing difference, between the first lane and the second lane.

7. The device of claim 6, further comprising:
  a calibration engine that controls the coarse, fine and ultrafine resolution timing circuits.

8. The device of claim 7, wherein the calibration engine controls the coarse, fine and ultrafine resolution timing circuits at startup and dynamically during operation of the device.

9. The device of claim 6, wherein at least one of the coarse, fine and ultrafine resolution timing circuits is in the first data path and at least one of the coarse, fine and ultrafine resolution timing circuits is in the first clock path.

10. The device of claim 9, wherein at least one of the coarse, fine and ultrafine resolution timing circuits is in the first lane and at least one of the coarse, fine and ultrafine resolution timing circuits is in the second lane.

11. The device of claim 6, wherein the coarse resolution timing circuit comprises:
  a first coarse resolution timing circuit in the first clock path; and
  a second coarse resolution timing circuit in the second clock path; and
  wherein the fine resolution timing circuit comprises:
    a first fine resolution timing circuit in the first clock path; and
    a second fine resolution timing circuit in the second clock path.

12. The device of claim 6, wherein the coarse resolution timing circuit comprises a first cascade of switched capacitor circuits in the first clock path; and
  wherein the fine resolution timing circuit comprises a second cascade of switched capacitor circuits in the first clock path.

13. The device of claim 6, wherein the ultrafine resolution timing circuit comprises:
  a first ultrafine resolution timing circuit in the first data path; and
  a second ultrafine resolution timing circuit in the second data path.

14. The device of claim 6, wherein the ultrafine resolution timing circuit comprises a programmable current circuit in the data path.

15. A method comprising:
  calibrating timing in a time-interleaved analog-to-digital converter (ADC) by:
    calibrating the timing in a plurality of stages of the ADC, the plurality of stages comprising a startup stage and a post startup stage;
    calibrating the timing in a plurality of paths of the ADC, the plurality of paths comprising a clock path and a data path; and
    calibrating the timing in a plurality of resolutions, the plurality of resolutions comprising coarse, fine and ultrafine resolutions.

16. The method of claim 15, further comprising:
  calibrating the timing in a plurality of techniques, the plurality of techniques comprising a first technique having a switched capacitor timing cell and a second technique having a variable current source buffer timing cell.

17. The method of claim 15, further comprising:
  calibrating the timing in a plurality of lanes of the ADC.

* * * * *